United States Patent [19]

Letkeman

[11] Patent Number: 5,383,121

[45] Date of Patent: Jan. 17, 1995

[54] METHOD OF PROVIDING COMPUTER GENERATED DICTIONARY AND FOR RETRIEVING NATURAL LANGUAGE PHRASES THEREFROM

[75] Inventor: Kim D. Letkeman, Nepean, Canada

[73] Assignee: Mitel Corporation, Ontario, Canada

[21] Appl. No.: 878,854

[22] Filed: May 5, 1992

[30] Foreign Application Priority Data

Sep. 11, 1991 [CA] Canada ............................... 2051135

[51] Int. Cl.6 ............................................. G06F 15/20
[52] U.S. Cl. ........................... 364/419.11; 364/429.08
[58] Field of Search ............. 364/419, 419.11, 419.15, 364/419.08, 419.04, 419.07

[56] References Cited

U.S. PATENT DOCUMENTS

| | | | |
|---|---|---|---|
| 4,365,315 | 12/1982 | Jamnik | 364/419.03 |
| 4,481,607 | 11/1984 | Kobayashi et al. | 364/419.02 |
| 4,959,785 | 9/1990 | Yamamoto et al. | 364/419.12 |
| 5,099,426 | 3/1992 | Carlgren et al. | 364/419.13 |
| 5,153,831 | 10/1992 | Yianilos | 364/419.13 |
| 5,191,622 | 3/1993 | Shojima et al. | |
| 5,214,583 | 5/1993 | Miike et al. | 364/419.04 |

Primary Examiner—Robert a. Weinhardt
Attorney, Agent, or Firm—Charles E. Wands

[57] ABSTRACT

A method of translating a command into natural language is comprised of the steps of: storing compressed words of the language once as either a word or subset of a word or group of adjoining words in a memory; storing a numeric indicator of each group of tokens which form a natural language string, with position locators; looking up the position locators in response to the command; accessing the memory to retrieve the compressed words; and providing a string of the tokens as a natural language string.

3 Claims, 2 Drawing Sheets

```
MEMORY
POSITION    CONTENT
  100          8   ⎫
  101        117   ⎪
  102          1   ⎪
  103        118   ⎪
  104          2   ⎬  INDEX OF TABLE
  105        120   ⎪   17 POSITIONS
  106          2   ⎪
   ⋮               ⎪
  115        128   ⎪
  116          1   ⎭
  117          7   ── TOKEN NO., 1st STRING
  118          7   ⎫
  119          3   ⎬  TOKEN NOS., 2nd STRING
  120          7   ⎭
  121          5   ⋮
  122          7
  123          4
  124          7
  125          6
  126          0
  127          1
  128          2
```

```
0 ─
1 ─ 5000
2 ─ 5001
3 ─ 5002
4 ─ 5003
  ─ 5004 ...                                    5021
RETRIEVEPREVIOUSCHANGE

TABLE 4
```

| TOKEN NO. | LOCATION | LENGTH |
|---|---|---|
| 7 | 5000 | 8 |
| 6 | 5009 | 9 |
| 4 | 5020 | 4 |
| 20 | 5015 | 2 |
| 5 | · | · |
| · | · | · |
| · | · | · |
| · | · | · |

TABLE 5

| MEMORY POSITION | CONTENT | |
|---|---|---|
| 100 | 8 | ⎫ |
| 101 | 117 | ⎪ |
| 102 | 1 | ⎪ |
| 103 | 118 | ⎬ INDEX OF TABLE |
| 104 | 2 | ⎪ 17 POSITIONS |
| 105 | 120 | ⎪ |
| 106 | 2 | ⎪ |
| ⋮ | | ⎪ |
| 115 | 128 | ⎪ |
| 116 | 1 | ⎭ |
| 117 | 7 | — TOKEN NO., 1st STRING |
| 118 | 7 | ⎫ TOKEN NOS., 2nd STRING |
| 119 | 3 | ⎭ |
| 120 | 7 | ⋮ |
| 121 | 5 | |
| 122 | 7 | |
| 123 | 4 | |
| 124 | 7 | |
| 125 | 6 | |
| 126 | 0 | |
| 127 | 1 | |
| 128 | 2 | |

FIG. 4

METHOD OF PROVIDING COMPUTER GENERATED DICTIONARY AND FOR RETRIEVING NATURAL LANGUAGE PHRASES THEREFROM

FIELD OF THE INVENTION

This invention relates to an electronic dictionary for providing responses to a user in a natural language and is advantageously used in a human-machine interface.

BACKGROUND TO THE INVENTION

Users of personal computers, telephones, switching systems, etc. communicate by means of a keyboard or other well known structures. The machine to which interface is made responds in some manner such as by displaying print on a display device, such as a monitor, or by providing an acoustic response. Where a system is provided that can be used in a variety of countries or locations in which the users speak a different language than the language of the manufacturer of the equipment, a translation of the response resulting from the input (command) is required.

It is desirable to provide a response to the user in natural language. However there are a number of problems associated with providing a human machine interface in several natural languages. For example, natural language words and phrases consume a lot of memory space. For commands and responses, there is a great deal of redundancy in the various words and phrases that are used. An example of such a structure and method containing substantial redundancy is found in U.S. Pat. No. 4,365,315 issued Dec. 21st, 1982 by Donald J. Kamnik.

When processing commands and reporting results to an operator, the phrases and words must be indexed and organized such that very quick matches and retrievals are possible.

An apparatus which is utilized by a user may have more than one input/output (I/O) port and allows commands that are entirely unrelated to be executed at the same time. This forces the dictionary search to provide access to all words and phrases at the same time. Since the entire human machine interface must be expressed in terms of phrases from the dictionary (and not hardcoded) matching and retrieving are required to be done hundreds or thousands of times for each command and response. This necessitates that all such dictionaries are stored in random access memory (RAM) for very fast processing. With an extensive library for translation of many languages, this can become extremely expensive, especially for consumer type items such as telephones. For larger systems, such as telephone switching systems, the excessive RAM required just for the language dictionaries could make the system uncompetitive in its markets.

Accordingly such apparatus such as telephone switching systems have operated in one language only. Those that do operate in a second language have corrupted the natural phrasing in the language to be translated to so that the phrases can be stored in parallel with the original phrases. Further, they can rarely operate in more than one language simultaneously.

Typically, such systems are slow to respond to the user in that they must load a particular set of phrases for each "form" that the user would like to program. This is inflexible and frustrating for the user.

SUMMARY OF THE PRESENT INVENTION

The present invention addresses an entire set of language words, phrases and strings into a memory, allowing the system to make available several different languages simultaneously. The compression, indexing and organization is based on individual phrases so that the phrasing and grammar of each language is not compromised. Compressed phrases may be reconstructed and matched very quickly, allowing the dictionaries to be used for any foreseeable human machine interface application. The human machine interface itself can be effectively decoupled from the actual presentation of the strings so that the addition of a new language dictionary does not require that the main system software environment be changed or rebuilt. A new language dictionary may be added to a running apparatus and may be used without restarting the apparatus software.

In accordance with an embodiment of the invention a method of providing a computer generated natural language dictionary including the steps for creating the dictionary is comprised of establishing a list of natural language dictionary strings comprised of separate words (tokens); assigning a separate numeric value to each different token, whereby the same numeric value is assigned to common tokens of various strings; establishing a table comprised of an index and list, the index being comprised of a first quantity representing the number of strings in the dictionary, and successive quantities representing positions in the list each followed immediately by a quantity representing the number of tokens in a string, the list being comprised of the assigned numeric value for each token in the list of dictionary strings; packing each token of the dictionary into a memory; establishing a table containing a correlation of each token number, the memory location at which it starts, and the length of the token; whereby upon specification of a command, the numbers of words in each string, the token numbers and the memory locations of the tokens of commanded string may be retrieved and displayed in the stored natural language string.

In accordance with another embodiment of the invention a method of retrieving natural language phrases is comprised of receiving a command; correlating tokens in the command with token numbers represented by or responsive to the command; reading a first table containing an index of the positions of the token numbers and numbers of words (tokens) in a natural language phrase in the table for a particular natural language; reading a second table correlating the token numbers read from the first table with a compressed token list and length of each token; reading the compressed token list to obtain the tokens in the order represented in the first table; and providing the tokens in order for representation or transmission to a user.

In accordance with another embodiment of the invention a method of translating a command into natural language is comprised of the steps of storing compressed words of the language once as either a word or subset of a word or group of adjoining words in a memory; storing a numeric indicator of each group of tokens which form a natural language string, with position locators; looking up the position locators in response to the command, accessing the memory to retrieve the compressed words; and providing a string of the tokens as a natural language string.

BRIEF INTRODUCTION TO THE DRAWINGS

A better understanding of the invention will be obtained by reference to the detailed description below, in conjunction with the following drawings, in which:

FIG. 4 illustrates the combination of Tables 2 and 3.

DESCRIPTION OF THE PREFERRED EMBODIMENT OF THE INVENTION

Figures 1, 2, 3:
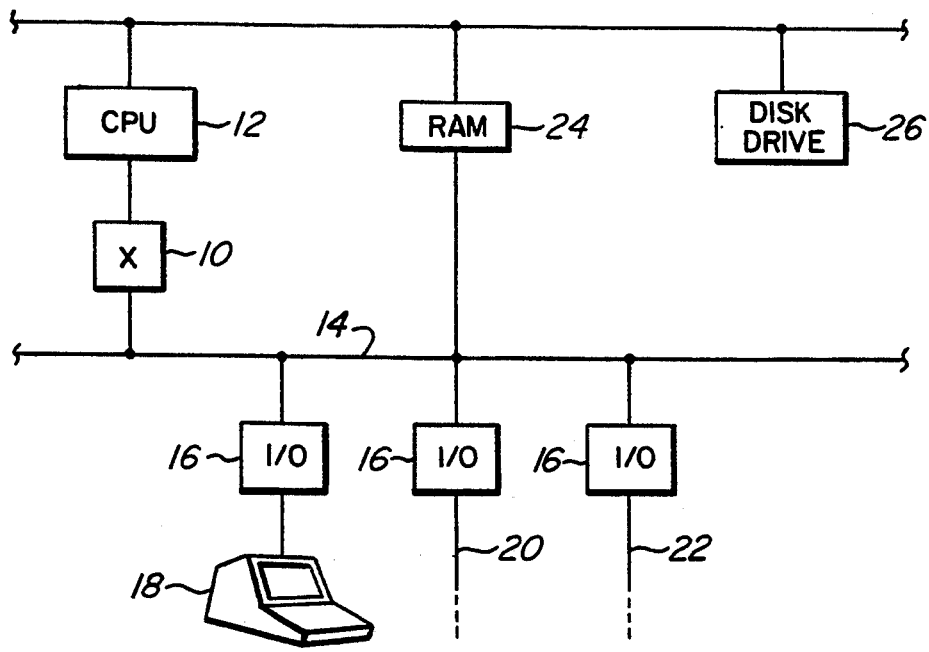
FIG. 1 is a block diagram of a representative structure in which the invention may be implemented.
FIG. 2 shows in Table 4 the packed tokens in RAM 24 which are retrieved to provide natural language phrases.
FIG. 3 illustrates in Table 5 a portion of RAM 24 in which correlation of token number, location of the beginning of the token and the length of the token is stored.

Turning to FIG. 1, a typical structural configuration in which the present invention may be implemented is illustrated. For use in a telephone switching system, for example, a switch 10, which may be a cross-point switch, a combination space and time division switch, etc., is operated by a central processing unit 12 in a well known manner. The central processing unit includes auxiliary memory, etc., (not shown) to enable its operation in a well known manner. The representative switch 10 is connected to a bus 14 to which peripherals 16 are connected. A peripheral may be connected to a computer type terminal 18, a line 20, a trunk 22, etc. The various peripherals will be referred to herein as ports, since they are places at which data and/or signalling may be incoming to or outgoing from the system.

To implement the invention, a random access memory 24 is connected to the central processing unit 12, and to the various ports. In the configuration shown, the connection to the ports is via bus 14, but other configurations can be used, to implement the invention. A disk drive memory with its controller 26 may be used for permanent storage of data to be loaded into random access memory 24.

Random access memory 24 is subdivided into divisions, each of which contains a table, to be described below.

The present invention provides responses to a user accessing the system via a port, in natural language. In a manner to be described below, each of the words of the natural language (e.g. English, French, Spanish, etc.) can be provided in a highly efficient manner.

The manner of creating the tables to be stored in random access memory 24 is as follows. The tables are lists of related data, the first data in the list being a "key" that uniquely identifies one instance of it in a particular language. The following example will be given for a particular language.

Let us assume that there are particular commands to be given via a port by the depression of a key, for example, and might be referred to as "tl1_commands". Examples of such commands could be tl1_retrieve
tl1_retrieve_first
tl1_retrieve_next
tl1_retrieve_last
tl1_retrieve_previous
tl1_add
tl1_change
tl1_delete In English, the strings that comprise this list might be as shown in the table below:

retrieve
retrieve first
retrieve next
retrieve last
retrieve previous
add
change
delete In any other natural language, an equivalent table would exist and would be associated internal to the switch with the name tl1_commands.

Inside the RAM 24, the user's preferred natural language is recorded and a pointer to that dictionary is made available in RAM via the aforenoted key. For all phrase or string matches and retrievals, that language dictionary is used. This can be done while another user (on another I/O port) is using a different language.

A condensed version of the words used in the strings are stored in RAM 24 at particular addresses, as will be described below. Each word is referred to as a token. To create the tables, the correspondence between the command and the natural language strings (i.e. a translation table) is processed as noted below, (can be processed if desired outside the switching system).

Each set of natural language translation tables is passed through a "filter" to extract the individual "tokens". A token is any grouping of characters separated by one or more spaces. For the previous example, the list of tokens would be "retrieve", "first", "next", "last", "previous", "add", "change" and "delete".

These tokens are then sorted and assigned an identifier, called the token id. In our example, the token id's are: add=0, change=1, delete=2, first=3, last=4, next=5, previous=6 and retrieve=7.

The original set of tables is then passed through a second filter which uses the sorted list of tokens to generate token references that describe each individual phrase in each table. For our example, the token lists would be:

TABLE 1

| | |
|---|---|
| retrieve | 7 |
| retrieve first | 7,3 |
| retrieve next | 7,5 |
| retrieve last | 7,4 |
| retrieve previous | 7,6 |
| add | 0 |
| change | 1 |
| delete | 2 | which is a very compact way of representing the strings in this particular enumeration.

The lists of references are then indexed in another file, where there is one set of indexes per individual table. The index for an individual table consists of a count of the number of strings in the table, followed by the position of each token list within the complete set of all token lists and the count of tokens for each token list.

Assume for our example that the index begins at position 100 in the overall reference file. Assume also that each value takes up one space. The index for this sample table would be:

TABLE 2

| | |
|---|---|
| number of strings | 8 |
| position of first list of tokens of 1 string (i.e. 7) | 117 |

TABLE 2-continued

| | |
|---|---|
| token count for that string | 1 |
| position of second list of tokens of 1 string (i.e. 7,3) | 118 |
| token count for that string, etc. | 2 |

The final reference table for this language table is (starting at position 100):

TABLE 3

8,117,1,118,2,120,2,122,
2,124, 2,126,1,127,1,128,1

The entire table takes up only 17 positions. See FIG. 4 to visualize the entire table stored in RAM 24, which is the combination of FIGS. 2 and 3.

The final step in building the language dictionary involves compressing the list of tokens and building an index into this compressed list. A compression algorithm should allow the token to be very quickly matched in real-time (i.e. small numbers of microseconds) such that many token reference lists may be scanned in looking for a particular string.

The list of tokens is now resorted in order by length, and within similar lengths they are sorted alphabetically. The tokens are then packed end to end into a memory buffer (i.e. RAM 24) starting with the set of longest tokens and proceeding to the set of shortest tokens.

Before a token is entered into the buffer, the buffer is scanned to see if that token is already present anywhere in the buffer. It may even be found as a subset of an earlier token or even as an overlap of two tokens that happen to have been placed next to each other.

If the token is found, its index entry records the position in which it was found and its length. If it was not found, it is appended to the buffer and its position and length are recorded.

This method allows the storage of a single token once, and in fact means that many tokens will not be stored at all, but will reuse the space that was used by a larger token that happens to be a superset of the token at hand.

Although the example used so far does not have any examples of smaller tokens existing as subsets of larger tokens, it does illustrate the power of eliminating repeated tokens. The token "retrieve" is used five times in the above example. Since it is eight characters long, it would normally use up forty characters plus five spaces for the word, plus two for the token position and length, for a total of ten. Using it another hundred times does not change this.

FIG. 2, illustrates as Table 4, a part of the compressed list stored in RAM 24. It consists of each of the words of the strings, entered once, or as contained as subsets. Above the packed list is shown a representative address of each letter of each word.

In operation, when a command e.g. from computer terminal 18 is given to the system via its associated I/O port, since the particular language used by the user has already been recorded in RAM 24 as associated with that port for that transaction, Tables 2 and 3 are scanned (FIG. 4). This returns the information of how many strings are contained in the compressed list of Table 4 and the position from Table 2 of how many words are in each string, and the token number.

This step leads directly to reading of FIG. 3, which illustrates in stored Table 5 the correlation of token number, memory location and length of token.

Thus from Table 2 it has been derived how many tokens are represented in each string, and which tokens are to be used, and scanning of Table 5 provides the memory location in Table 4 of each token, by number, and its length.

Under control of the CPU 12 RAM 24 thus can retrieve very quickly the tokens, in sequence, that make up a response to the user, in the user's natural language.

Similar groups of tables are used for each natural language. The CPU can time share for each user, accessing each group of tables.

If in the natural language the strings contain punctuation, the punctuation characters could be removed from the token and a simple bit map could be stored with the individual reference to the token, describing how to process the token when extracted. For example, a leading bracket or a trailing bracket or period could be indicated by separate bits. As well, the token could have originally appeared capitalized or in all capitals, and could be restored upon extraction.

In other words, the tokens "forever", "Forever", "FOREVER", "(forever)" and "forever." would all reference the compressed token "forever".

While this adds memory overhead, i.e. taking an extra space for each token in a token list, it still provides a very powerful way of sharing the token's memory space, since it means that all of the individual words are still stored the same, regardless of their appearance in different tables or strings.

It should be noted that this invention can be utilized in various types of apparatus, and is not restricted to the telephone switching system shown. For example it can be implemented on a personal computer or in a telephone. The response need not be displayed on a monitor, but can be provided acoustically, or by any other means.

For example, a telephone itself can contain this invention, to provide a "call by name" or "telephone directory search" function. A compressed dictionary of users could be stored in the telephone, easing storage requirements which would otherwise be very expensive in a mass produced device such as a telephone.

A person understanding this invention may now conceive of alternative structures and embodiments or variations of the above. All of those which fall within the scope of the claims appended hereto are considered to be part of the present invention.

I claim:

1. A method of providing a computer-generated natural language dictionary, said computer having computer-associated memory, comprising the steps of:
   (a) subdividing storage space of said computer-associated memory into a plurality of memory tables;
   (b) generating a plurality of natural language dictionary strings comprised of a plurality of separate tokens, respective ones of which tokens comprise groups of characters separated by one or more spaces;
   (c) assigning a separate numeric value as a token number to each different token, whereby the same numeric value is assigned as the same token number to common tokens of various strings;

(d) storing the tokens of said natural language dictionary in said computer-associated memory;
(e) storing a first memory table in said computer-associated memory, said first memory table having an index and a list, said index being comprised of a first quantity representative of the number of strings in said list of natural language dictionary strings, and successive second quantities representative of the positions of respective strings in said plurality of natural dictionary strings, each position being immediately followed by a third quantity representative of the number of tokens in an associated dictionary string, said list being comprised of the assigned numeric value for each token in each of said strings; and
(f) storing a second memory table in said computer-associated memory, said second memory table containing a correlation of each token number, a storage location in said computer-associated memory at which each token starts, and the length of the token.

2. A method according to claim 1, further comprising the step of (g) retrieving natural language phrases from said computer-generated natural language dictionary by:
(g1) receiving a command containing tokens;
(g2) correlating tokens in said command with token numbers represented by or responsive to said command;
(g3) accessing said first and second tables in accordance with token numbers correlated in step (g2), so as to read out tokens stored in said computer-associated memory; and
(g4) providing the tokens read out in step (g3) in a prescribed order to a user.

3. A computer-generated natural language dictionary comprising a computer and a computer-associated memory, said memory having a first portion which stores tokens of said natural language dictionary, respective ones of said tokens comprising groups of characters separated by one or more spaces, and wherein a separate numeric value is assigned as a token number to each different token, whereby the same numeric value is assigned as the same token number to common tokens of various natural language dictionary strings of separate tokens, said memory further having a first memory table which stores an index and a list, said index being comprised of a first quantity representative of the number of strings in said plurality of natural language dictionary strings, and successive second quantities representative of the positions of respective strings in said plurality of natural dictionary strings, each position being immediately followed by a third quantity representative of the number of tokens in an associated dictionary string, said list being comprised of the assigned numeric value for each token in each of said strings, said memory further including a second memory table which stores a correlation of each token number, a storage location in said computer-associated memory at which each token starts, and the length of the token,
and wherein said computer is operative, in response to receipt of a command containing tokens, to correlate tokens in said command with token numbers represented by or responsive to said command, and to access said first and second tables in accordance with correlated token numbers so as to read out tokens stored in said computer-associated memory and to provide the tokens read out in a prescribed order to a user.

* * * * *